(12) United States Patent
Kim et al.

(10) Patent No.: US 12,232,259 B2
(45) Date of Patent: Feb. 18, 2025

(54) PRINTED CIRCUIT BOARD INCLUDING CONDUCTIVE PAD AND ELECTRIC DEVICE USING THE SAME

(71) Applicant: Samsung Electronics Co., Ltd., Gyeonggi-do (KR)

(72) Inventors: Bongsoo Kim, Gyeonggi-do (KR); Gyeongmin Jin, Gyeonggi-do (KR); Hakjoon Kim, Gyeonggi-do (KR); Jaebum Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 18/107,129

(22) Filed: Feb. 8, 2023

(65) Prior Publication Data

US 2023/0199953 A1   Jun. 22, 2023

Related U.S. Application Data

(63) Continuation of application No. PCT/KR2022/010090, filed on Jul. 12, 2022.

(30) Foreign Application Priority Data

Aug. 4, 2021   (KR) .................. 10-2021-0102697

(51) Int. Cl.
*H05K 1/00* (2006.01)
*H05K 1/11* (2006.01)
*H05K 3/34* (2006.01)

(52) U.S. Cl.
CPC ........... *H05K 1/111* (2013.01); *H05K 3/3436* (2013.01); *H05K 2201/099* (2013.01)

(58) Field of Classification Search
CPC . H05K 1/111; H05K 3/3436; H05K 2201/099
See application file for complete search history.

(56) References Cited

U.S. PATENT DOCUMENTS

| 10,582,615 B2 | 3/2020 | Noguchi et al. |
| 2005/0105478 A1 | 5/2005 | Hwang et al. |

(Continued)

FOREIGN PATENT DOCUMENTS

| JP | 2001-230513 A | 8/2001 |
| JP | 2013-55208 A | 3/2013 |

(Continued)

OTHER PUBLICATIONS

JP 2014072371; English Translation (Year: 2014).*

*Primary Examiner* — Pete T Lee
(74) *Attorney, Agent, or Firm* — Cha & Reiter, LLC

(57) ABSTRACT

An electronic device according to an embodiment may include: a Printed Circuit Board (PCB) including a first face and a second face; a semiconductor chip mounted on the second face; a conductive pad disposed on the second face; a solder resist layer disposed on the second face and including an aperture; an arc-shaped opening having an inner diameter and an outer diameter, disposed along an outer periphery of the conductive pad and in the aperture; and at least one external terminal disposed on the semiconductor chip and bonded to the conductive pad. The conductive pad may include: a first region having a smaller diameter than the outer diameter; and at least one second region extending from the first region in a first outer circumferential direction, and located at least in part between both ends of the opening. In addition, various embodiments recognized through the specification may also be possible.

20 Claims, 12 Drawing Sheets

(56) References Cited

U.S. PATENT DOCUMENTS

| | | |
|---|---|---|
| 2008/0157389 A1 | 7/2008 | Park et al. |
| 2008/0198566 A1 | 8/2008 | Minota et al. |
| 2009/0189271 A1 | 7/2009 | Hur et al. |
| 2009/0196003 A1 | 8/2009 | Fujii |
| 2010/0065965 A1 | 3/2010 | Daubenspeck et al. |
| 2010/0164101 A1 | 7/2010 | Lee et al. |
| 2011/0304058 A1 | 12/2011 | Pendse |
| 2016/0027752 A1 | 1/2016 | Chuang et al. |

FOREIGN PATENT DOCUMENTS

| | | |
|---|---|---|
| JP | 5393986 B2 | 10/2013 |
| JP | 2013-258347 A | 12/2013 |
| JP | 6750872 B2 | 8/2020 |
| JP | 6772232 B2 | 10/2020 |
| KR | 10-2004-0083192 A | 10/2004 |
| KR | 10-2005-0013773 A | 2/2005 |
| KR | 10-0546832 B1 | 1/2006 |
| KR | 10-0816762 B1 | 3/2008 |
| KR | 10-2009-0005560 A | 1/2009 |
| KR | 20-2009-0006889 U | 7/2009 |
| KR | 10-2010-0079389 A | 7/2010 |
| KR | 10-2011-0003188 A | 1/2011 |
| KR | 10-2011-0013902 A | 2/2011 |
| KR | 10-2011-0135329 A | 12/2011 |
| KR | 10-1407614 B1 | 6/2014 |

\* cited by examiner

PRINTED CIRCUIT BOARD INCLUDING CONDUCTIVE PAD AND ELECTRIC DEVICE USING THE SAME

CROSS-REFERENCE TO RELATED APPLICATIONS

This application is a Bypass continuation application of International Application No. PCT/KR2022/010090 designating the United States, filed on Jul. 12, 2022, in the Korean Intellectual Property Receiving Office and claiming the benefit under 35 USC § 119(a) of Korean Patent Application No. 10-2021-0102697 filed on Aug. 4, 2021, in the Korean Intellectual Property Office, the entire disclosures of which are incorporated herein by reference for all purposes.

TECHNICAL FIELD

One or more embodiments disclosed in the instant disclosure generally relate to a printed circuit board including a conductive pad, and an electronic device incorporating the printed circuit board.

BACKGROUND

For high performance and convenience in portability, electronic devices are becoming smaller in size and higher in computing capacity. Accordingly, a plurality of semiconductor chips used in the electronic device need to provide a greater number of external terminals on Printed Circuit Board (PCB) while reducing the mounting area of the PCB.

A semiconductor chip package may be classified variously into Chip On Film (COF)-type semiconductor package, Board On Chip (BOC)-type semiconductor chip package, Lead On Chip (LOC)-type semiconductor package, Ball Grid Array (BGA)-type semiconductor chip package, etc., depending on the structure and functions therefor.

For example, the BGA-type semiconductor chip package may be suitable for small size, high-performance products. The BGA-type semiconductor chip package may provide an external terminal, e.g., a solder ball, as an input/output terminal for transferring electrical signals between semiconductor chips in the package and external circuit boards, so that the semiconductor chip and the external circuit board are electrically coupled to each other. The BGA-type semiconductor package has increased mounting density, and usage thereof is increasing with high integration of the semiconductor chip.

In the BGA-type semiconductor chip package, external terminals of the semiconductor chip may be respectively adhered to conductive pads disposed on one face of the PCB.

For example, in case of using a Solder Mask Defined (SMD) pad, outer peripheries of the conductive pad is covered by a solder resist layer, and external terminals may be adhered to an upper face of the exposed pad. As another example, in case of using a Non-Solder Mask Defined (NSMD) pad, outer peripheries of the conductive pad are exposed by a solder resist layer, and external terminals may be adhered not only to the outer peripheries of the pads but also to wiring lines.

However, when the PCB of the electronic device is in a half board shape, various components may be mounted on the upper face/lower face of the PCB in an overlapping manner without spaces therebetween. In particular, a Power Management Semiconductor Chip (PMIC) may be located on the rear face of the PCB while a memory may be disposed on the upper face thereof.

When a defect such as Printed Circuit Board Assembly (PBA) thermal shock occurs, the PMIC located on the rear face of the PCB cannot be moved to another location. Therefore, when a solder ball crack occurs due to the PBA thermal shock, a crack may occur in the semiconductor chip with a thin Under Bump Metallurgy (UBM) thickness as shown in FIG. 12.

SUMMARY

According to certain embodiments of the disclosure, there is provided a PCB having a bonding structure capable of preventing cracks in the bonding structure, which may occur in semiconductor chips due to an unbalanced shape of a conductive pad constructed on a PCB. A semiconductor chip package using the PCB is also provided.

According to an embodiment of the disclosure, an electronic device may include: a Printed Circuit Board (PCB) including a first face facing a first direction and a second face facing a second direction opposite to the first direction; a semiconductor chip mounted on the second face; at least one conductive pad disposed on the second face; a solder resist layer disposed on the second face and including an aperture for exposing the at least one conductive pad; at least one arc-shaped opening having an inner diameter and an outer diameter, disposed along an outer periphery of the at least one conductive pad and in the aperture; and at least one external terminal disposed on the semiconductor chip and bonded to the at least one conductive pad. The at least one conductive pad may include: a first region having a smaller diameter than the outer diameter; and at least one second region extending from the first region in a first outer circumferential direction, and located at least in part between both ends of the opening.

According to certain embodiments disclosed in the disclosure, when thermal shock of a semiconductor chip package occurs, rigidity of a bonding structure of the semiconductor chip can be compensated.

BRIEF DESCRIPTION OF DRAWINGS

With regard to the description of the drawings, similar reference numerals may be used to refer to similar or related elements.

DETAILED DESCRIPTION

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure.

Figure 1:
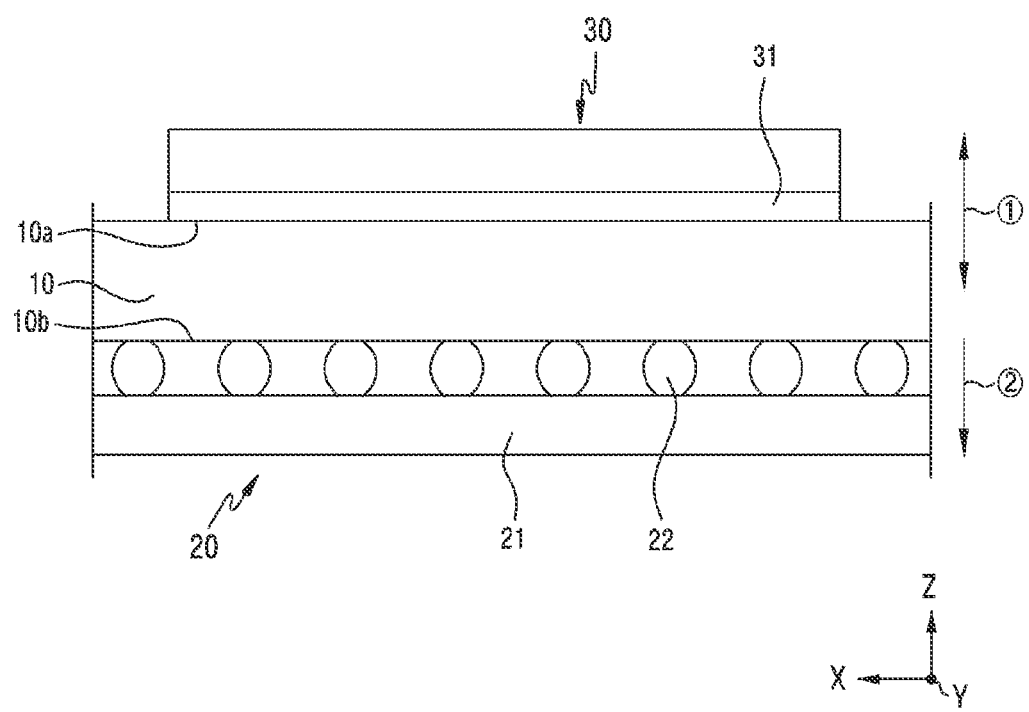
FIG. 1 is a side view illustrating a semiconductor chip package in which a semiconductor chip is bonded to a Printed Circuit Board (PCB) according to an embodiment of the disclosure.
Figure 2:
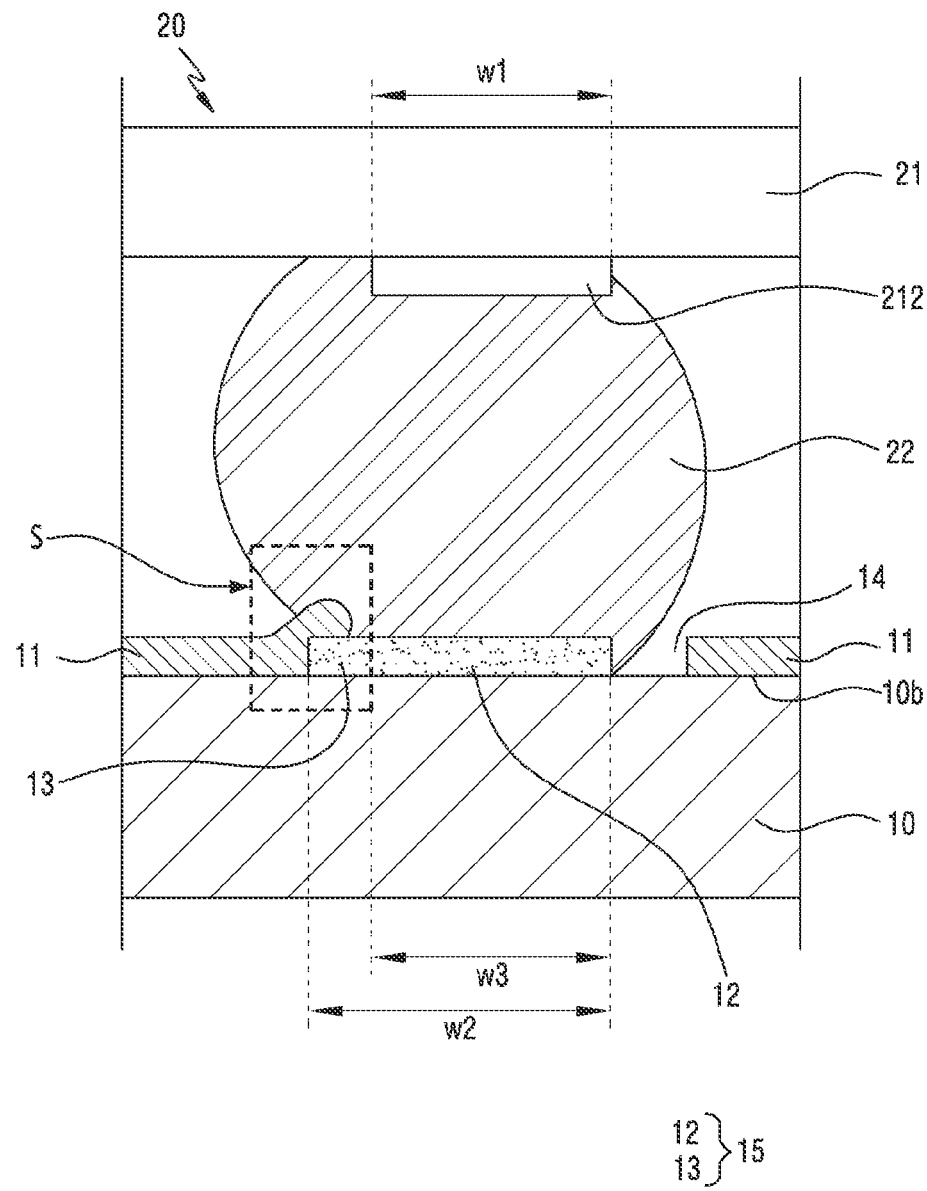
FIG. 2 is an enlarged view illustrating part of the bonding structure of FIG. 1.

FIG. 1 is a side view illustrating a semiconductor chip package in which a semiconductor chip is bonded to a Printed Circuit Board (PCB) according to an embodiment of the disclosure. FIG. 2 is an enlarged view illustrating part of a bonding structure of FIG. 1.

Referring to FIG. 1 and FIG. 2, a PCB 10 according to an embodiment is a component mounted on an electronic device, and may include a first face 10a facing a first direction ① (e.g., an upward direction) and a second face 10b facing a second direction ② (e.g., a downward direction) opposite to the first direction ①. For example, the PCB 10 may be provided in a plate shape, and the first face 10a and the second face 10b may refer to opposite faces, e.g., an upper face and a lower face, respectively. According to an embodiment, the PCB 10 may be made with a rigid material, a flexible material, or a combination thereof, and may include an appropriate insulator, e.g., one or a plurality of insulation resins.

According to an embodiment, the PCB 10 may have at least one conductive pad constructed on the second face 10b so as to be bonded to a semiconductor chip 20. For example, a plurality of conductive pads may be constructed to be spaced apart from each other and be aligned on the second face 10b. The conductive pads may be bonded to respective external terminals 22 of the semiconductor chip 20. The reference numeral 21 may refer to the molding portion of the semiconductor chip 20.

According to an embodiment, a first semiconductor chip 30 may be mounted on the first face 10a of the PCB 10 via a connection portion 31. For example, a conductive pad corresponding to a conductive pad (not shown) constructed on the first semiconductor chip 30 may be constructed on the connection portion 31. According to an embodiment, a soldering process using a solder ball may be used for the connection portion 31 of the first semiconductor chip 30. For example, a Surface Mount Design (SMD) process may be used for the connection. Alternatively, wire bonding may be used. For example, the first semiconductor chip 30 may include a memory element and/or a logic element, but the scope of the disclosure is not limited to the type of the semiconductor chip 30.

According to an embodiment, the second semiconductor chip 20 may be mounted on the second face 10b of the PCB 10. According to an embodiment, the second semiconductor chip 20 may be adhered using a soldering bump process. For example, the second semiconductor chip 20 may include a Power Management Semiconductor Chip (PMIC), but the scope of the disclosure is not limited to the type of the semiconductor chip 20. Hereinafter, for illustrative purposes, the PMIC will be referred to as the semiconductor chip 20.

According to an embodiment, the semiconductor chip 20 may have at least one Under Bump Metallurgy (UBM) 212 disposed thereon so as to be bonded to the conductive pad of the PCB 10. For example, the UBM 212 may be a conductive portion to which the external terminal 22 is bonded. According to an embodiment, the UBM 212 may be shaped to have a specific width w1 and thickness, and the plurality of UBMs may be aligned on one face of a molding portion of the semiconductor chip 20. According to an embodiment, the width w1 of each of the UBMs 212 may be smaller than the width w2 of the conductive pad 15 and equal to the width w3 of the first region 12, but is not necessarily limited in size to the width w3 of the first region.

According to an embodiment, the number of external terminals 22 may be appropriately selected depending on the type and capacity of the semiconductor chip 20. For example, the external terminals 22 may be implemented as conductive bumps, e.g., solder balls.

According to an embodiment, when the semiconductor chip 20 is bonded to the second face 10b of the PCB 10 through a bonding process, signals can be transferred between the semiconductor chip 20 and the conductive pad 15 via the bonding structure provided by each of the external terminals 22 of the semiconductor chip 20.

Figure 3:
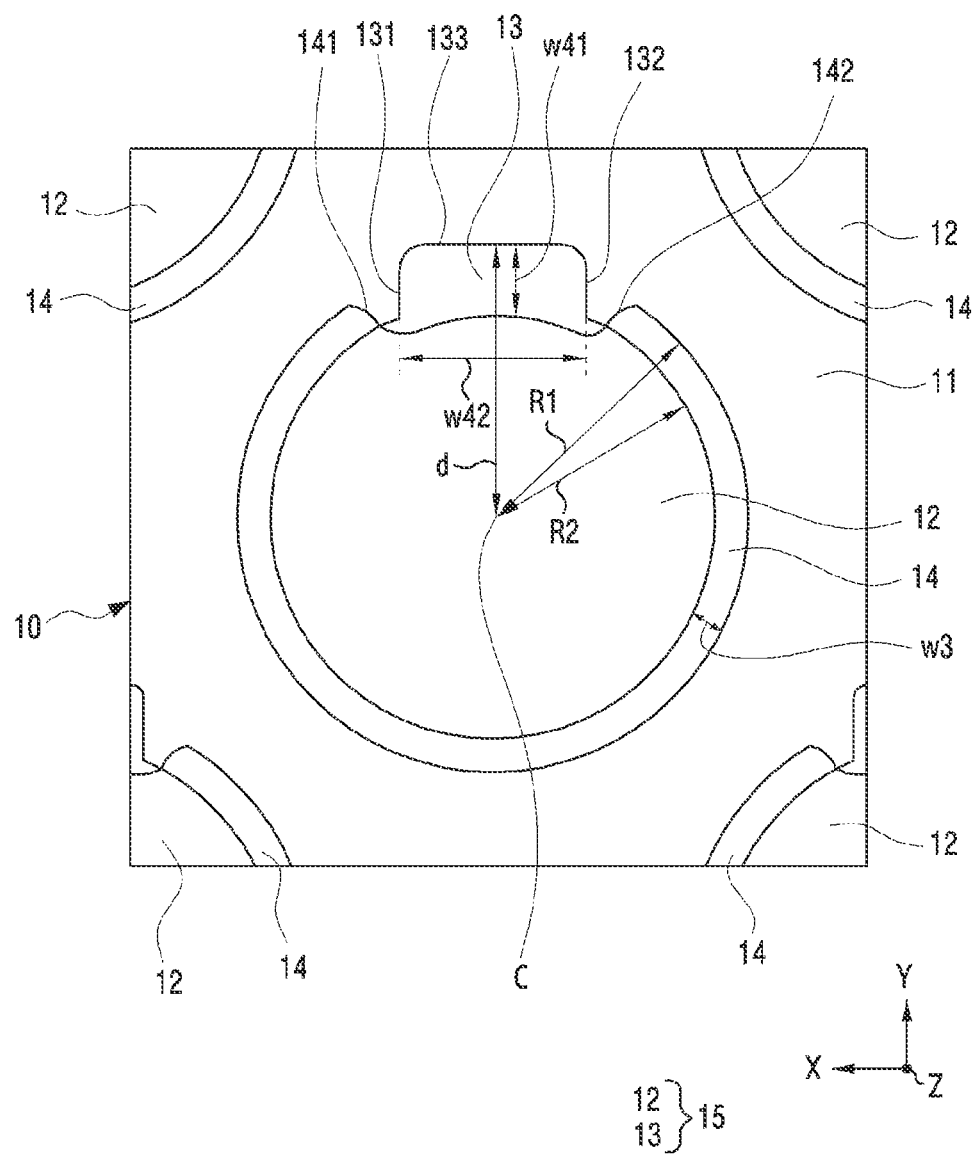
FIG. 3 is an enlarged plan view illustrating the shape of a conductive pad constructed on a PCB according to an embodiment of the disclosure.
Figure 4:
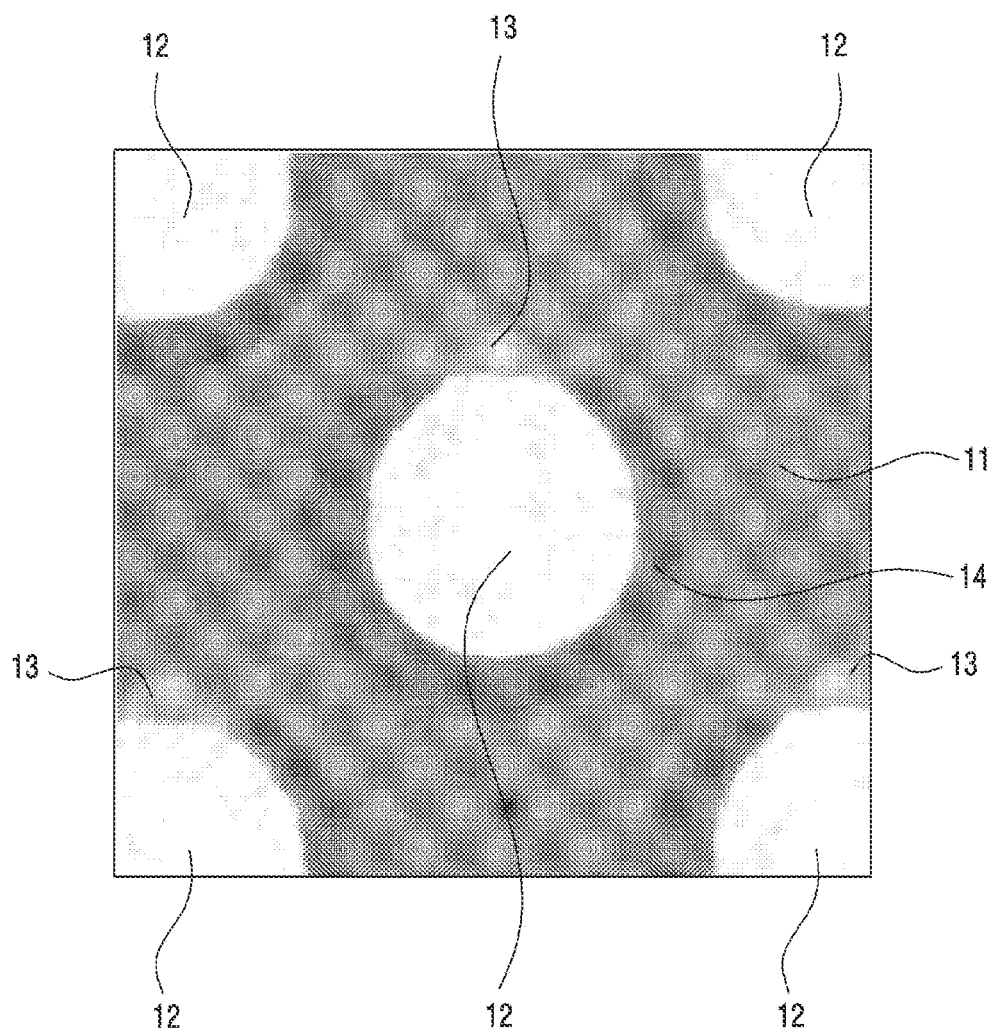
FIG. 4 is an enlarged photo illustrating the conductive pad of FIG. 3.

FIG. 2 is an enlarged view illustrating part of the bonding structure of FIG. 1. FIG. 3 is an enlarged plan view illustrating the shape of a conductive pad constructed on a PCB according to an embodiment of the disclosure. FIG. 4 is an enlarged photo illustrating the conductive pad of FIG. 3.

Referring to FIG. 2 to FIG. 4, a PCB 10 according to an embodiment may have a solder resist layer 11 constructed on a second face 10b. According to an embodiment, an aperture may be constructed on the solder resist layer 11, so that each of conductive pads 15 is at least partially or entirely exposed.

According to an embodiment, the PCB 10 may have at least one opening 14 disposed between the conductive pad 15 and the solder resist layer 11. According to an embodiment, the opening 14 may be included in the aperture. The opening 14 may be adjacent to the first region 12, and have an arc shape (see FIG. 3). According to an embodiment, the opening 14 may be a space which allows each of the first regions 12 to be spaced apart from the solder resist layer 11.

According to an embodiment, the opening 14 may include an inner diameter and an outer diameter. The outer diameter may have a first radius size R1, and the inner diameter may have the same size as a second radius size R2 of the first region 12. According to an embodiment, the opening 14 may include one end 141 and the other end 142, and the one end 141 and the other end 142 may be spaced apart. According to an embodiment, the opening 14 may have a specific third width w3 which also is the minimum distance between the outer diameter and the inner diameter.

According to an embodiment, the conductive pad 15, which has an unbalanced shape, in that it may include the first region 12 and a second region 13. According to an embodiment, the first region 12 has a substantially circular shape in the second radius size R2 from a center C, the second radius size R2 being smaller than a first radius size R1. For example, the second radius size R2 of the first region 12 may be the same as the inner diameter of the opening 14.

According to an embodiment, the conductive pad 15 may additionally include at least one second region 13 at an outer periphery. According to an embodiment, the second region 13 may have a shape extending or protruding from the first region 12 in the outer circumferential direction. According to an embodiment, the second region 13 may be in the shape of a protrusion extending from the first region 12.

According to an embodiment, the second region 13 may include one side face 131, another side face 132 opposite to the one side face, and an outer peripheral face 133. According to an embodiment, the outer peripheral face 133 may be located between the one side face 131 and the other side face 132. For example, the outer peripheral face 133 may be a face located farthest from the center C.

According to an embodiment, the outer peripheral face 133 of the second region 13 may be spaced apart by a distance d in the outer circumferential direction from the center C of the first region 12. The distance may include a fourth width w41 from the first region 12. According to an embodiment, the distance d in the outer circumferential direction may be equal to, or greater than or equal to, the first radius size R1 of the opening 14. For example, the second region 13 may have a shape in which the fourth width w41 is approximately 40 micrometers and the width w42 from left to right is 60 micrometers. In addition, according to an embodiment, the distance d of the outer circumferential direction may be in the range between the first radius size R1 of the opening 14 and the second radius size R2 of the first region 12.

According to an embodiment, when the opening 14 has a diameter of approximately 40 micrometers, the fourth width w41 of the second region 13 may be approximately 40 to 50 micrometers. Both w41 and w42 may be larger than the minimum distance between the outer diameter and the inner diameter of the opening 14.

According to an embodiment, the one side face 131 of the second region 13 may be spaced apart by a first distance from the one end 141 of the opening 14, and the other side face 132 thereof may be spaced apart by a second distance from the other end 142 of the opening 14. For example, the first distance and the second distance may be substantially identical to each other.

According to an embodiment, at least one portion of the second region 13 may include an overlapping structure S which overlaps with part of the solder resist layer 11. According to an embodiment, in the bonding process of the semiconductor chip 20, a bonding structure may be constructed such that an external terminal 22 is pushed relatively upwardly (i.e. away from the second face 10b) due to the thickness of the overlapping structure S. For example, the bonding structure of the semiconductor chip package may be constructed such that the bonding structure is relatively thick at a bonding portion located on the second region 13, compared to the first region 12. Such a bonding structure may be caused by the overlapping structure S of the second region 13 and the solder resist layer 11.

Figure 11:
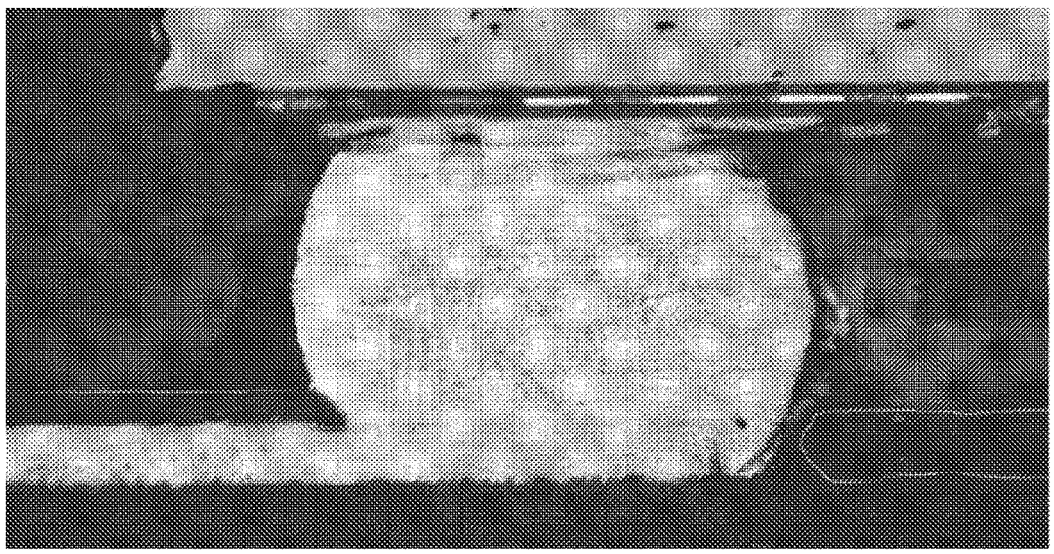
FIG. 11 is an enlarged photo illustrating a state where a semiconductor chip is bonded to a PCB according to an embodiment of the disclosure.
Figure 12:
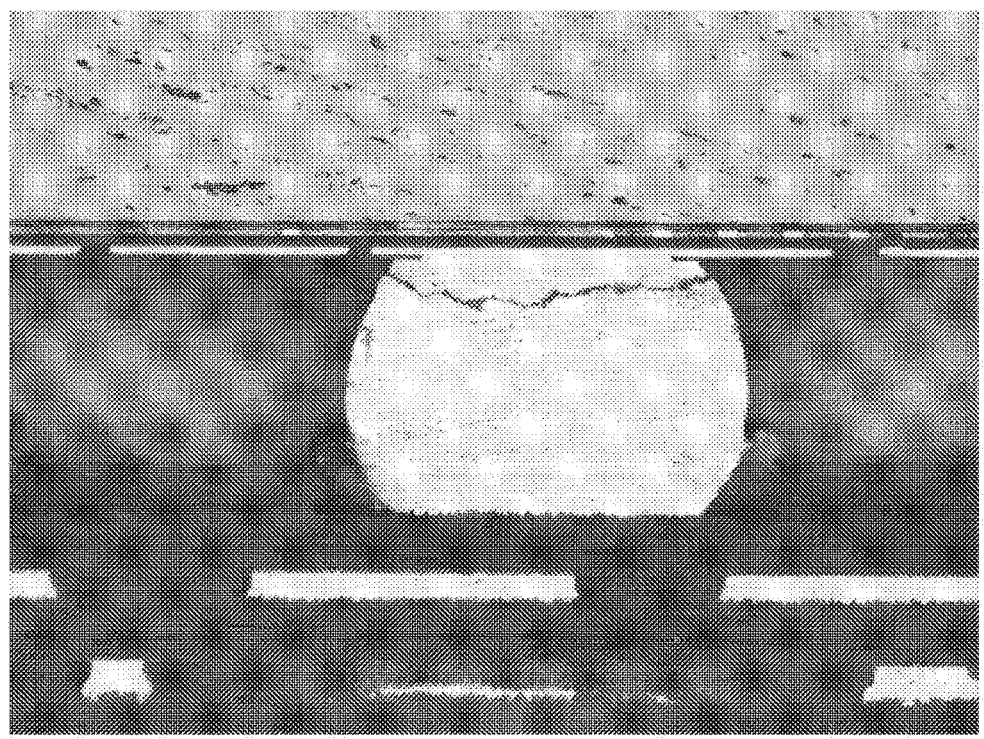
FIG. 12 is an enlarged photo illustrating a state where a crack occurs in a bonding structure in which a semiconductor chip is bonded to a conventional PCB.

According to an embodiment, in the bonding process of the semiconductor chip 20, due to the overlapping structure S of the semiconductor chip 20 and the second region 13, one portion of the external terminal 22 is pushed upward on one side by the thickness of the overlapping structure. Since the overlapping structure S is configured to support the external terminal 22 which is pushed upward, the external terminal 22 may be constructed to adhere better on the second region 13. A photo of the bonding structure constructed by the overlapping structure S between the second region 13 and the solder resist layer 11 is shown in FIG. 11.

Hereinafter, embodiments of two or more conductive regions additionally constructed in the first region 12 will be described with reference to FIG. 5 to FIG. 11.

Figure 5:
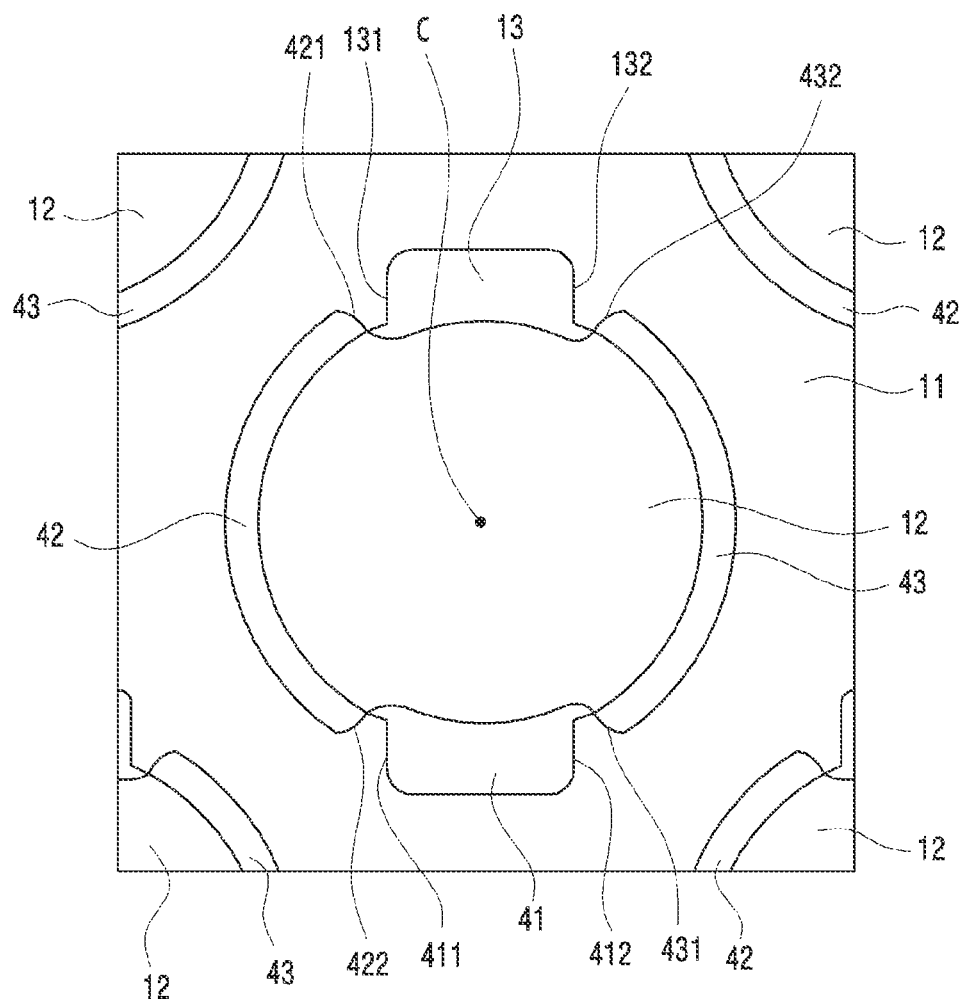
FIG. 5 is an enlarged plan view illustrating a shape of a conducive pad constructed on a PCB according to another embodiment of the disclosure.
Figure 6:
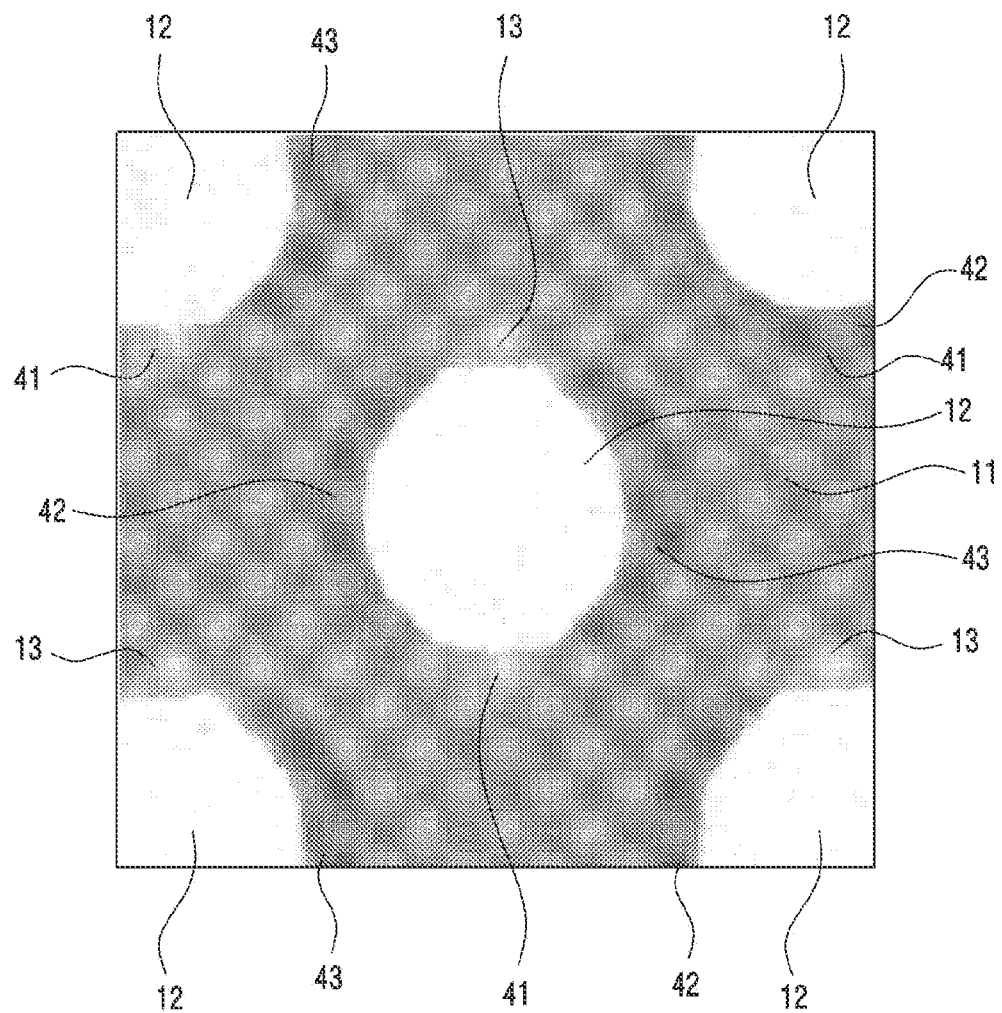
FIG. 6 is an enlarged photo illustrating the conductive pad of FIG. 5.

FIG. 5 is an enlarged plan view illustrating a shape of a conducive pad constructed on a PCB according to another embodiment of the disclosure. FIG. 6 is an enlarged photo illustrating the conductive pad of FIG. 5.

Referring to FIG. 5 and FIG. 6, a plurality of conductive pads constructed on the PCB 10 may include first to third regions 12, 13, and 41. According to an embodiment, the first region 12 may be the same as the first region 12 of FIG. 2 to FIG. 4. Each of the second and third regions 13 and 41 may be the same as the second region 13 of FIG. 4, and may include an overlapping structure S.

According to an embodiment, the conductive pad constructed on the PCB may include the first region 12, the second region 13 extending from the first region 12 in a first outer circumferential direction, and the third region 41 extending from the first region 12 in a second outer circumferential direction. For example, the first and second outer circumferential directions may be opposite to each other. According to an embodiment, the second and third regions 13 and 41 may be disposed symmetrically with respect to the center C of the first region 12.

According to an embodiment, an opening 44 located at an outer periphery of the first region 12 may include first and second openings 42 and 43. According to an embodiment, the first opening 42 having an arc shape may be disposed between the second and third regions 13 and 41. The second opening 14 having an arc shape may be disposed between the second and third regions 13 and 41, and may be disposed symmetrically to the first opening 14 with respect to the center C of the first region.

According to an embodiment, the second region 13 may be disposed between one end 421 of the first opening 42 and the other end 432 of the second opening 43. According to an embodiment, one side face 131 of the second region 13 may be spaced apart by a first distance from the one end 421 of the first opening 42, and the other side face 132 thereof may be spaced apart by a second distance from the other end 432 of the second opening 43. For example, the first and second distances may be identical to each other.

According to an embodiment, the third region 41 may be disposed between the other end 422 of the first opening 42 and one end 431 of the second opening 43. According to an embodiment, one side face 411 of the third region may be spaced apart by a third distance from the other end 422 of the first opening 42, and the other side face 412 thereof may be spaced apart by a fourth distance from the one end 431 of the second opening 43. For example, the third and fourth distances may be identical to each other, and the third and fourth distances may be identical to the first and second distances.

According to an embodiment, at least a part of each of the second region 13 and third region 41 may constitute the overlapping structure S of FIG. 2 which includes part of a solder resist layer (e.g., the solder resist layer 11 of FIG. 2).

Figure 7:
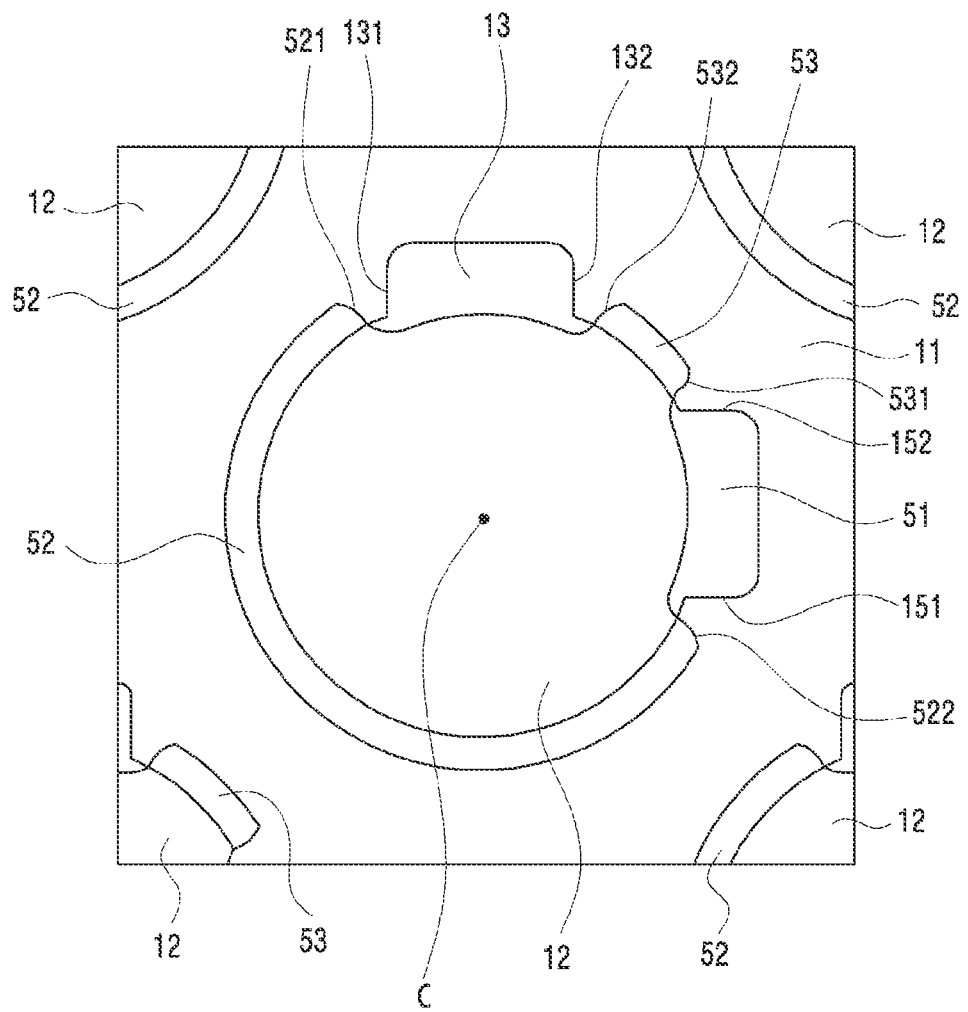
FIG. 7 illustrates an enlarged shape of a conductive pad constructed on another PCB according to yet another embodiment of the disclosure.

FIG. 7 illustrates an enlarged shape of a conductive pad constructed on another PCB according to another embodiment of the disclosure.

Referring to FIG. 7, a plurality of conductive pads constructed on the PCB 10 may include first to third regions 12, 13, and 51. According to an embodiment, the first region 12 may be the same as the first region 12 of FIG. 2 to FIG. 4. Each of the second and third regions 13 and 51 may be the same as the second region 13 of FIG. 4, and may include an overlapping structure S.

According to an embodiment, the plurality of conductive pads constructed on the PCB may include the first region 12, the second region 13 extending from the first region 12 in a first outer circumferential direction, and the third region 51 extending from the first region 12 in a second outer circumferential direction. For example, the first and second outer circumferential directions may be perpendicular to each other.

According to an embodiment, the second and third regions 13 and 51 may be disposed asymmetrically with respect to the center C of the first region 12.

According to an embodiment, an opening located at an outer periphery of the first region 12 may include first and second openings 52 and 53. According to an embodiment, the first opening 52 having an arc shape may be disposed between the second and third regions 13 and 51. The second opening 53 having an arc shape may be disposed between the second and third regions 13 and 51, and may be disposed asymmetrically to the first opening 52. According to an embodiment, the first opening 52 may be asymmetrical to the second opening 53 with respect to the center C of the first region 12, and the second opening 53 may be shorter in length than the first opening 52.

According to an embodiment, the second region 13 may be disposed between one end 521 of the first opening 52 and the other end 532 of the second opening 53. According to an embodiment, one side face 131 of the second region 13 may be spaced apart by a first distance from the one end 521 of the first opening 52, and the other side face 132 thereof may be spaced apart by a second distance from the other end 532 of the second opening 53. For example, the first and second distances may be identical to each other.

According to an embodiment, the third region 51 may be disposed between the other end 522 of the first opening 52 and one end 531 of the second opening 53. According to an embodiment, one side face 151 of the third region 51 may be spaced apart by a third distance from the other end 522 of the first opening 52, and the other side face 152 thereof may be spaced apart by a fourth distance from the one end 531 of the second opening 53. For example, the third and fourth distances may be identical to each other, and the third and fourth distances may be identical to the first and second distances.

According to an embodiment, at least a part of each of the second region 13 and third region 51 may constitute the overlapping structure S of FIG. 2 which includes part of a solder resist layer (e.g., the solder resist layer 11 of FIG. 2).

Figure 8:
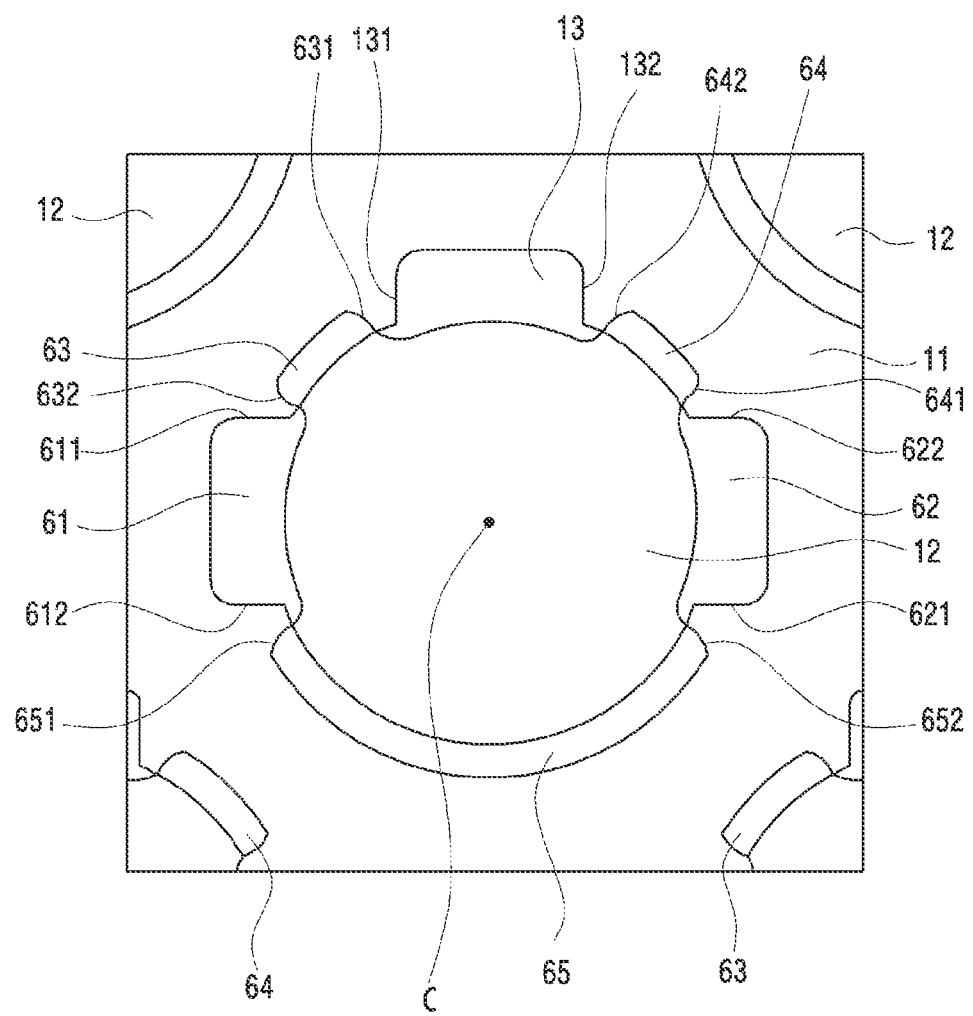
FIG. 8 illustrates an enlarged shape of a conductive pad constructed on another PCB according to still another embodiment of the disclosure.

FIG. 8 illustrates an enlarged shape of a conductive pad constructed on another PCB according to yet another embodiment of the disclosure.

Referring to FIG. 8, a plurality of conductive pads constructed on the PCB 10 may include first to fourth regions 12, 13, 61, and 62. According to an embodiment, the first region 12 may be the same as the first region 12 of FIG. 2 to FIG. 4. Each of the second to fourth regions 13, 61, and 62 may be the same as the second region 13 of FIG. 4, and may include an overlapping structure S.

According to an embodiment, the conductive pad constructed on the PCB may include the first region 12, the second region 13 extending from the first region 12 in a first outer circumferential direction, the third region 61 extending from the first region 12 in a second outer circumferential direction, and the fourth region 62 extending from the first region 12 in a third outer circumferential direction. For example, the first and second outer circumferential directions may be perpendicular to each other. The first and third outer circumferential directions may be perpendicular to each other. The second and third outer circumferential directions may be opposite to each other. According to an embodiment, the third and fourth regions 61 and 62 may be disposed to symmetrically with respect to the center C of the first region 12.

According to an embodiment, an opening located at an outer periphery of the first region 12 may include third and fourth openings 63, 64, and 65. According to an embodiment, the first opening 63 having an arc shape may be disposed between the second and third regions 13 and 61. The second opening 64 having an arc shape may be disposed between the second and fourth regions 13 and 62. The third opening 65 may be disposed between the third and fourth regions 61 and 62. According to an embodiment, the first and second openings 63 and 64 may be disposed symmetrically with respect to the center C of the first region 12.

According to an embodiment, the second region 13 may be disposed between one end 631 of the first opening 63 and the other end 642 of the second opening 64. According to an embodiment, one side face 131 of the second region 13 may be spaced apart by a first distance from the one end 631 of the first opening 63, and the other side face 132 thereof may be spaced apart by a second distance from the other end 642 of the second opening 64. For example, the first and second distances may be identical to each other.

According to an embodiment, the third region 61 may be disposed between the other end 632 of the first opening 63 and one end 651 of the third opening 65. According to an embodiment, one side face 611 of the third region 61 may be spaced apart by a third distance from the other end 632 of the first opening 63, and the other side face 612 thereof may be spaced apart by a fourth distance from the one end 651 of the second opening 65. For example, the third and fourth distances may be identical to each other, and the third and fourth distances may be identical to the first and second distances.

According to an embodiment, the fourth region 62 may be disposed between the other end 641 of the second opening 64 and one end 652 of the third opening 65. According to an embodiment, one side face 621 of the fourth region 62 may be spaced apart by a fifth distance from the other end 652 of the third opening 65, and the other side face 622 thereof may be spaced apart by a sixth distance from the one end 641 of the second opening 64. For example, the fifth and sixth distances may be identical to each other, and the fifth and sixth distances may be identical to the first and second distances.

According to an embodiment, at least a part of each of the second region 13 and third and fourth regions 61 and 62 may constitute the overlapping structure S of FIG. 2 which includes part of a solder resist layer (e.g., the solder resist layer 11 of FIG. 2).

Figure 9:
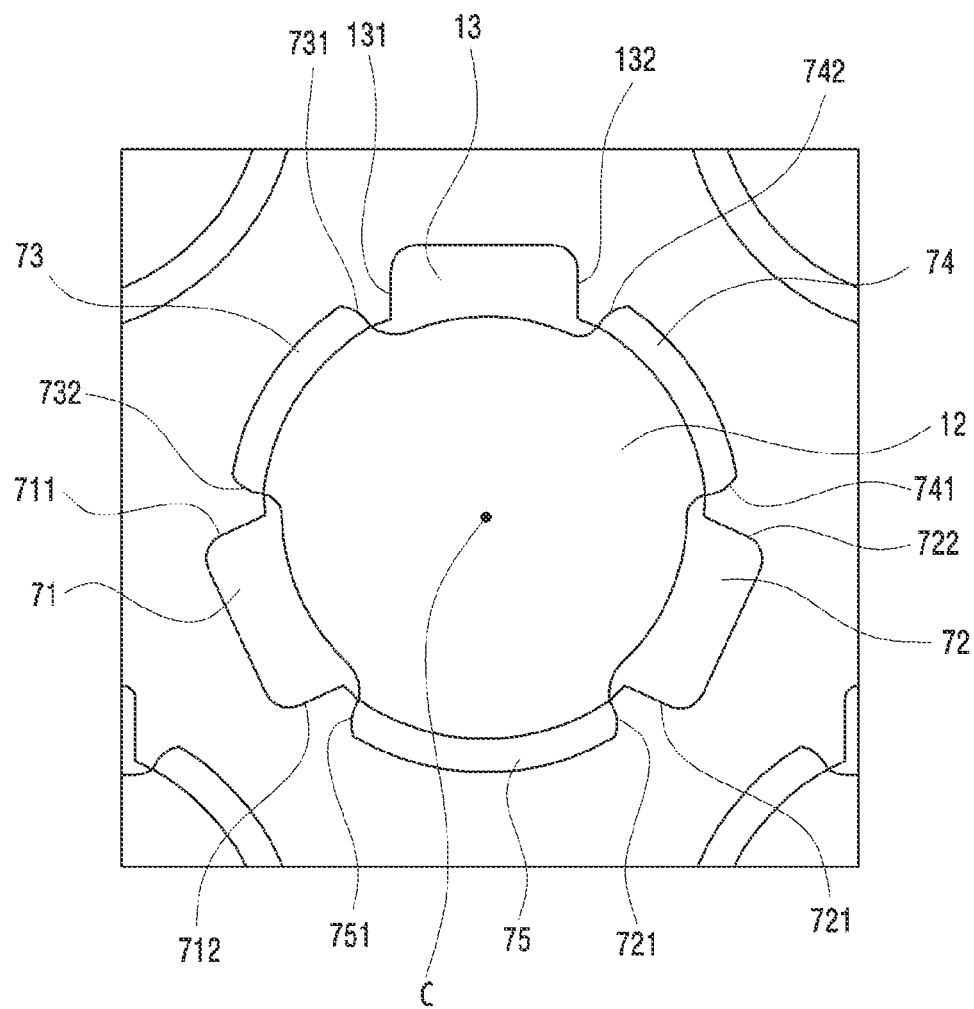
FIG. 9 illustrates an enlarged shape of a conductive pad constructed on another PCB according to still yet another embodiment of the disclosure.

FIG. 9 illustrates an enlarged shape of a conductive pad constructed on another PCB according to still yet another embodiment of the disclosure.

Referring to FIG. 9, a plurality of conductive pads constructed on the PCB 10 may include first to fourth regions 12, 13, 71, and 72. According to an embodiment, the first region 12 may be the same as the first region 12 of FIG. 2 to FIG. 4. Each of the second to fourth regions 13, 71, and 72 may be the same as the second region 13 of FIG. 4.

According to an embodiment, the conductive pad constructed on the PCB may include the first region 12, the second region 13 extending from the first region 12 in a first outer circumferential direction, the third region 71 extending from the first region 12 in a second outer circumferential direction, and the fourth region 72 extending from the first region 12 in a third outer circumferential direction. According to an embodiment, the first to third outer circumferential directions are spaced apart from one another by 120 degrees with respect to a center C. For example, if the first outer circumferential direction faces the direction of 0 degrees (360 degrees), the second outer circumferential direction may face the direction of 240 degrees, and the third outer circumferential direction may face the direction of 120 degrees. According to an embodiment, the third and fourth regions 71 and 72 may be disposed to be symmetrically about the Y-axis, where the origin of the Y-axis is the center C of the first region 12.

According to an embodiment, an opening located at an outer periphery of the first region 12 may include third and fourth openings 73, 74, and 75. According to an embodiment, the first opening 73 having an arc shape may be disposed between the second and third regions 13 and 71. The second opening 74 having an arc shape may be disposed between the second and fourth regions 13 and 72. The third opening 75 may be disposed between the third and fourth regions 71 and 72. According to an embodiment, the first and second openings 73 and 74 may be disposed symmetrically with respect to the center C of the first region 12. For example, the first, second, and third openings 73, 74, and 75 may have the same length.

According to an embodiment, the second region 13 may be disposed between one end 731 of the first opening 73 and the other end 742 of the second opening 74. According to an embodiment, one side face 131 of the second region 13 may be spaced apart by a first distance from the one end 731 of the first opening 73, and the other side face 132 thereof may be spaced apart by a second distance from the other end 742 of the second opening 74. For example, the first and second distances may be identical to each other.

According to an embodiment, the third region 71 may be disposed between the other end 732 of the first opening 73 and one end 751 of the third opening 75. According to an embodiment, one side face 711 of the third region 71 may be spaced apart by a third distance from the other end 732 of the first opening 73, and the other side face 712 thereof may be spaced apart by a fourth distance from the one end 751 of the second opening 75. For example, the third and fourth distances may be identical to each other, and the third and fourth distances may be identical to the first and second distances.

According to an embodiment, the fourth region 72 may be disposed between the other end 741 of the second opening 74 and one end 752 of the third opening 75. According to an embodiment, one side face 721 of the fourth region 72 may be spaced apart by a fifth distance from the other end 752 of the third opening 75, and the other side face 722 thereof may be spaced apart by a sixth distance from the one end 741 of the second opening 74. For example, the fifth and sixth distances may be identical to each other, and the fifth and sixth distances may be identical to the first and second distances.

According to an embodiment, at least a part of each of the second region 13 and third and fourth regions 71 and 72 may constitute the overlapping structure S of FIG. 2 which includes part of a solder resist layer (e.g., the solder resist layer 11 of FIG. 2).

Figure 10:
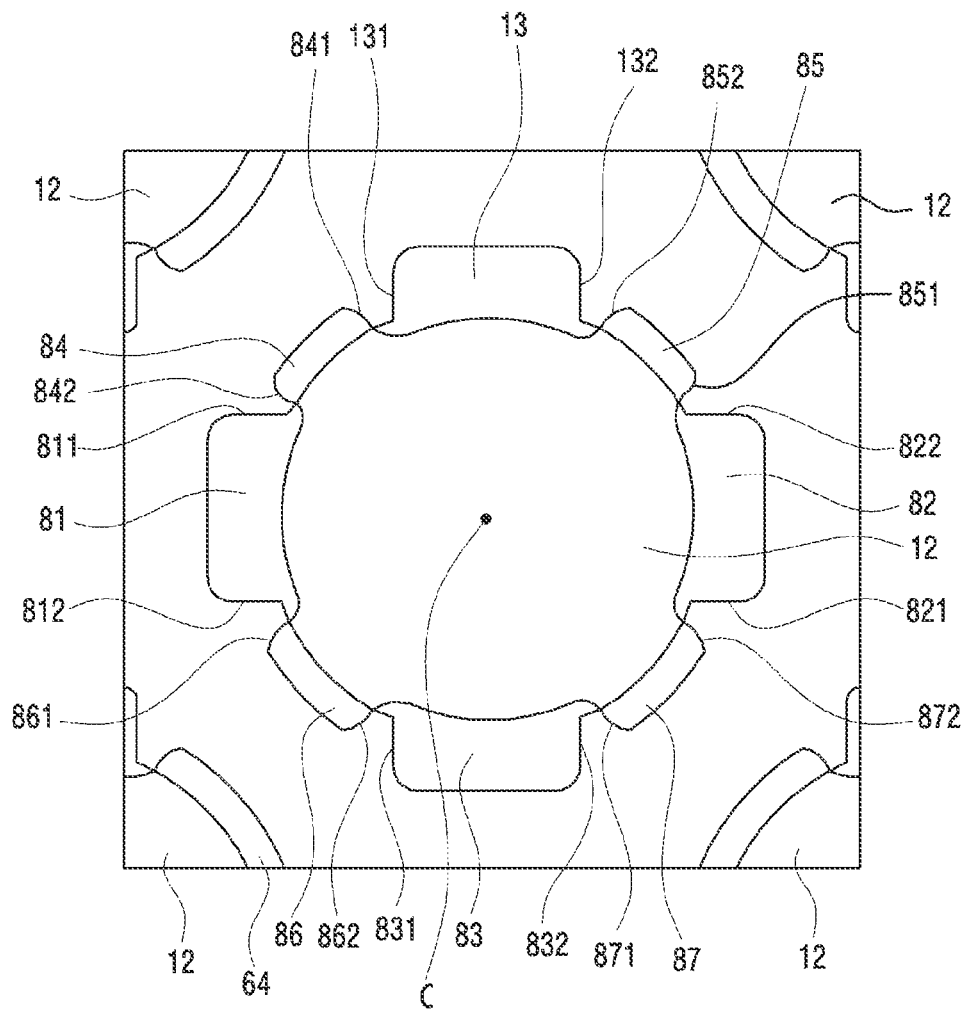
FIG. 10 illustrates an enlarged shape of a conductive pad constructed on another PCB according to still yet another embodiment of the disclosure.

FIG. 10 illustrates an enlarged shape of a conductive pad constructed on another PCB according to still yet another embodiment of the disclosure.

Referring to FIG. 10, a plurality of conductive pads constructed on the PCB 10 may include first to fifth regions 12, 13, 81, 82, and 83. According to an embodiment, the first region 12 may be the same as the first region 12 of FIG. 2 to FIG. 4. Each of the second to fifth regions 13, 81, 82, and 83 may be the same as the second region 13 of FIG. 4.

According to an embodiment, the conductive pad may include the first region 12, the second region 13 extending from the first region 12 in a first outer circumferential direction, the third region 81 extending from the first region 12 in a second outer circumferential direction, the fourth region 82 extending from the first region 12 in a third outer circumferential direction, and the fifth region 83 extending from the first region 12 in a fifth outer circumferential direction.

According to an embodiment, the first to fourth outer circumferential directions may be spaced apart from one another by 90 degrees from one another with respect to a center C. For example, the first and second outer circumferential directions may be perpendicular to each other. The first and third outer circumferential directions may be perpendicular to each other. The second and fourth outer circumferential directions may be perpendicular to each other. The third and fourth outer circumferential directions may be perpendicular to each other. In addition, the first and fourth circumferential directions may be opposite to each other, and the second and third outer circumferential directions may be opposite to each other.

According to an embodiment, the second and fifth regions 13 and 83 may be symmetrical with respect to the X-axis whose origin is the center of the first region 12, and the third and fourth regions 81 and 82 may be symmetrical with respect to the Y-axis whose origin is the center.

According to an embodiment, an opening located at an outer periphery of the first region 12 may include first to fourth openings 84 to 87. According to an embodiment, the first opening 84 having an arc shape may be disposed between the second and third regions 13 and 81. The second opening 85 having an arc shape may be disposed between the second and fourth regions 13 and 82. The third opening 86 may be disposed between the third and fifth regions 81 and 83. The fourth opening 87 may be disposed between the fourth and fifth regions 82 and 83.

According to an embodiment, the first and second openings 84 and 85 may be symmetrical to each other with respect to the center C of the first region 12. For example, the first and second openings 84 and 85 may be constructed to have the same length, and may be symmetrical about the Y-axis. According to an embodiment, the third and fourth openings 86 and 87 may be symmetrical to each other with respect to the center C of the first region 12. For example, the third and fourth openings 86 and 87 may be constructed to have the same length, and may be symmetrical about the Y-axis. According to an embodiment, the first and third openings 84 and 86 may be symmetrical to each other with respect to the center C of the first region 12. For example, the first and third openings 84 and 86 may be constructed to have the same length, and may be symmetrical about the X-axis. According to an embodiment, the second and fourth openings 85 and 87 may be symmetrical to each other with respect to the center C of the first region 12. For example, the second and fourth openings 85 and 87 may be constructed to have the same length, and may be symmetrical about the X-axis.

According to an embodiment, the second region 13 may be disposed between one end 841 of the first opening 84 and the other end 852 of the second opening 85. According to an embodiment, one side face 131 of the second region 13 may be spaced apart by a first distance from the one end 841 of the first opening 84, and the other side face 132 thereof may be spaced apart by a second distance from the other end 852 of the second opening 85. For example, the first and second distances may be identical to each other.

According to an embodiment, the third region 81 may be disposed between the other end 842 of the first opening 84 and one end 861 of the third opening 86. According to an embodiment, one side face 811 of the third region may be spaced apart by a third distance from the other end 842 of the first opening 84, and the other side face 812 thereof may be spaced apart by a fourth distance from the one end 861 of the second opening 86. For example, the third and fourth distances may be identical to each other, and the third and fourth distances may be identical to the first and second distances.

According to an embodiment, the fourth region 82 may be disposed between the other end 852 of the second opening 85 and one end 871 of the fourth opening 87. According to an embodiment, one side face 821 of the fourth region may be spaced apart by a fifth distance from the other end 872 of the fourth opening 87, and the other side face 822 thereof may be spaced apart by a sixth distance from one end 851 of the second opening 85. For example, the fifth and sixth distances may be identical to each other, and the fifth and sixth distances may be identical to the first and second distances.

According to an embodiment, at least a part of each of the second region 13 and third, fourth, and fifth regions 81, 82, and 83 may constitute the overlapping structure S of FIG. 2 which includes part of a solder resist layer (e.g., the solder resist layer 11 of FIG. 2).

The invention claimed is:

1. An electronic device comprising:
    a Printed Circuit Board (PCB) comprising a first face facing a first direction and a second face facing a second direction opposite to the first direction;
    a semiconductor chip mounted on the second face;
    at least one conductive pad disposed on the second face;
    a solder resist layer disposed on the second face and including at least one opening for exposing the at least one conductive pad, wherein the at least one opening having an inner diameter and an outer diameter, disposed along an outer periphery of the at least one conductive pad; and
    at least one external terminal disposed on the semiconductor chip and bonded to the at least one conductive pad,
    wherein the at least one conductive pad comprises:
    a first region having a smaller diameter than the outer diameter; and
    at least one second region extending from the first region in a first outer circumferential direction, and located at least in part between both ends of the at least one opening,
    wherein at least part of the second region is overlapped with at least part of the solder resist layer, and
    wherein one side portion of the at least one external terminal is pushed by the at least part of the solder resist layer.

2. The electronic device of claim 1, further comprising an overlapping structure in which the at least part of the second region and the at least part of the solder resist layer overlap.

3. The electronic device of claim 2, wherein the overlapping structure further comprises:
    at least part of the at least one conductive pad; and
    at least part of the solder resist layer overlapping on one face of the at least one conductive pad facing the second direction.

4. The electronic device of claim 3, wherein the one side portion of the at least one external terminal is pushed further away from the second face relative to another side portion of the at least one external terminal due to the overlapping structure.

5. The electronic device of claim 1, wherein the second region further comprises:
    one side face;
    another side face facing the one side face; and
    an outer peripheral face disposed between the one side face and the other side face.

6. The electronic device of claim 5, wherein a length in the first outer circumferential direction, from a center of the first region to the outer peripheral face of the second region, is greater than or equal to the outer diameter of the at least one opening.

7. The electronic device of claim 6, wherein a width in the first outer circumferential direction of the second region is greater than a width between the inner and outer diameters of the at least one opening.

8. The electronic device of claim 5, wherein a distance between the one side face and the other side face of the second region is greater than a width between the inner and outer diameters of the at least one opening.

9. The electronic device of claim 5, wherein the one side face is spaced apart by a first distance from one end of the at least one opening, and the other side face of the second region is spaced apart by a second distance from another end of the at least one opening.

10. The electronic device of claim 9, wherein a memory chip is disposed on the first face of the PCB opposite the semiconductor chip.

11. A PCB bonded to a semiconductor chip, the PCB comprising:
    a first face facing a first direction;
    a second face facing a direction opposite to the first direction;
    at least one conductive pad disposed on the second face;
    a solder resist layer disposed on the second face and including an aperture for exposing the at least one conductive pad;
    at least one arc-shaped opening having an inner diameter and an outer diameter, disposed along an outer periphery of the at least one conductive pad, and surrounded by the solder resist layer,
    wherein the at least one conductive pad comprises:
    a first region having a diameter; and
    a second region protruding from the first region in a first outer circumferential direction and at least partially located between both ends of the at least one opening,
    wherein at least part of the second region is overlapped with at least part of the solder resist layer, and
    wherein one side portion of at least one external terminal is pushed by the at least part of the solder resist layer.

12. The PCB of claim 11, further comprising an overlapping structure in which the at least part of the second region and at least part of the solder resist layer overlap.

13. The PCB of claim 11, wherein the second region further comprises:
    one side face;
    another side face facing the one side face; and
    an outer peripheral face disposed between the one side face and the other side face,
    wherein a length in the first outer circumferential direction, from a center of the first region to the outer peripheral face of the second region, is greater than or equal to the outer diameter of the at least one opening.

14. The PCB of claim 13, wherein a width in the first outer circumferential direction of the second region is greater than a width between the inner and outer diameters of the at least one opening.

15. The PCB of claim 13, wherein a distance between the one side face and the other side face of the second region is greater than a width between the inner and outer diameters of the at least one opening.

16. The PCB of claim 13, wherein the one side face is spaced apart by a first distance from one end of the at least one opening, and the other side face of the second region is spaced apart by a second distance from another end of the at least one opening.

17. An electronic device comprising:
a PCB comprising a first face facing a first direction and a second face facing a second direction opposite to the first direction;
a semiconductor chip mounted on the second face;
at least one conductive pad disposed on the second face;
a solder resist layer disposed on the second face and including an aperture for exposing the at least one conductive pad;
a plurality of arc-shaped opening having an inner diameter and an outer diameter, disposed along an outer periphery of the at least one conductive pad and in the aperture; and
at least one external terminal disposed on the semiconductor chip and bonded to the at least one conductive pad, wherein the at least one conductive pad comprises:
a first region having a smaller diameter than the outer diameter;
a second region extending from the first region in a first outer circumferential direction; and
at least one third region extending from the first region in a second outer circumferential direction.

18. The electronic device of claim 17, wherein the first outer circumferential direction is opposite or perpendicular to the second outer circumferential direction.

19. The electronic device of claim 17, wherein the at least one third region is disposed symmetrically or asymmetrically to the second region with respect to a center of the first region.

20. The electronic device of claim 17, wherein the at least one third region comprises a plurality of third regions, and each of the plurality of third regions is disposed to be equidistant from the second region with respect to a center of the first region.

* * * * *